(12) United States Patent
Cooper et al.

(10) Patent No.: US 6,904,399 B2
(45) Date of Patent: Jun. 7, 2005

(54) SIMPLIFIED MODELING SOFTWARE INTERFACE AND METHOD

(75) Inventors: John Cooper, Oxford, MI (US); Paul Francis Altamore, Farmington Hills, MI (US); William Edward Rockwell, Novi, MI (US)

(73) Assignees: Key Safety Systems, Inc., Sterling Heights, MI (US); TNO Madymo North America, Livonia, MI (US)

( * ) Notice: Subject to any disclaimer, the term of this patent is extended or adjusted under 35 U.S.C. 154(b) by 316 days.

(21) Appl. No.: 10/127,994

(22) Filed: Apr. 23, 2002

(65) Prior Publication Data

US 2003/0200074 A1 Oct. 23, 2003

Related U.S. Application Data

(60) Provisional application No. 60/286,069, filed on Apr. 24, 2001.

(51) Int. Cl.$^7$ .............................. G06F 9/45; G06F 7/48
(52) U.S. Cl. ................................ 703/22; 703/2; 703/8; 717/104; 701/45; 180/272; 180/287
(58) Field of Search .......................... 280/735, 728.1, 280/801.1; 703/2, 8, 22; 717/100, 104; 701/36, 45; 297/216.1; 180/271, 272, 274, 287

(56) References Cited

U.S. PATENT DOCUMENTS 5,583,771 A    12/1996   Lynch et al. .......... 364/424.045
5,636,424 A     6/1997   Singer et al. ............ 29/407.01
5,695,242 A    12/1997   Brantman et al. ........ 297/216.1
6,422,595 B1 *  7/2002   Breed et al. ................ 280/735
6,459,973 B1 * 10/2002   Breed et al. .................. 701/45

OTHER PUBLICATIONS

CSE in Industry / Computing in Science & Engineering Robustness Optimization for Vehiclular Crash Simulations by Ren–Jye Yang et al., Dec. 2000.

IEEE Transactions on Rehabilitation Engineering, vol. 7, No. 2 Computer Simulation and Sled Test Validation of a Powerbase Wheelchair & Occupant Subjected to Frontal Crash Conditions by Bertocci et al., Jun. 1999.

Applications / IEEE Computer Graphics and Applications At Oak Ridge, a Car Crash on the World Wide Web by Dave Sims / Editor: Michael J. Potel, May 1995.

Benchmarking the Performance of Physical Impact Simulation Software on Vector and Parallel Computers By Myron Ginsberg, GM Research Laboratories and James P. Johnson, German Motors Corp.

* cited by examiner

Primary Examiner—Russell Frejd
(74) Attorney, Agent, or Firm—Markell Seitzman

(57) ABSTRACT

Disclosed is a simulation based environment that allows a product based engineer, with a modest understanding of complex software programs, to use complex math models. The system provides an interface by which basic component models can be used within the simulation. Allowances are made for particular variables to be adaptable by the product based engineer.

23 Claims, 1 Drawing Sheet

SIMPLIFIED MODELING SOFTWARE INTERFACE AND METHOD

FIELD OF THE INVENTION

This is a regularly filed utility patent application claiming priority of provisional patent application 60/286,069, filed Apr. 24, 2001. The present invention relates to a simplified interface for a software modeling system and, more particularly to a user interface that significantly decreases the complexity and training for the user and reduces the knowledge base necessary for the user of the software package.

BACKGROUND OF THE INVENTION

Complex computer models that simulate events in the physical world often require the use of multiple and complex computer models and components to accurately predict real world situations. The use of complex modeling software often requires specialized skills for the formation of the models. To gain the skill set necessary to use a complex modeling software, extensive training is necessary for a user to gain the necessary acumen to quickly and properly configure the software "data deck" or input configurations and conditions. This data deck, which can have thousands of variables, is used to define the environment of the physical model including spatial variables. Often the software includes pre and post processors to assist in the formation and interpretation of the modeled system.

In addition to being able to understand the software preprocessor, which allows for the definition of these variables, a user must be able to understand the physical environment and limitations of those modeled real world components within a given model. The user must also be able to understand the output provided through the post processing code of the model to make sure that the answers "make sense." As such, the inherent complexities involved in the development of the model, combined with the requisite understanding of the physical world that the model tries to represent, significantly limit the number of users who are qualified to use a given complex software simulation package.

SUMMARY OF THE INVENTION

As such, a software system having components that assist in overcoming these limitations is desirable. A software system and interface, which utilize a system wherein a modeling expert is used to formulate the initial model, is presented. The modeling expert may or may not be familiar with specific components used to define an original model environment and a system. A non-modeling expert, who need not be familiar with the complex modeling system but who is familiar with specific component properties, will then use a simplified software interface or preprocessor to make the changes to the models and environmental conditions. The simplified modeling interface allows for the use of a stored library of components that can be inserted into the model as needed by the user. The use of the library of components will significantly reduce the complexity of the interface and the knowledge needed, by the user, to make the above modifications to the model.

Additionally, the system will incorporate at least one "software advisor" to assist the user in the formation of the model. One software advisor will be used to look for errors in the model that arise due to specific limitations in the modeling software. A second software advisor will provide the user with a knowledge base to reduce or eliminate errors in the design of the system with respect to the incorporated real world components. The second advisor will also help the user use inputted components and read (or interpret) the output of the software in such a way that the designed system "makes sense" in view of past real world exposure.

The purpose of this tool is to create a simulation-based environment that allows a product-based restraint engineer, with a modest understanding of complex software programs, to use complex math models, i.e. MADYMO™, to solve product-based issues. The MADYMO™ simulation software, which is widely available, currently requires an experienced simulation modeling expert to model a complex simulation such as a vehicle crash modeling and then interpret the results. As with other modeling software, the MADYMO™ software format and its nature are complicated and require training and extensive use for a current user to become effective. The present invention provides an interface for the most basic components of a simulation software such that a product engineer would also be able to utilize and benefit from the results of simulation.

As such, it is an object of the present invention to provide a simplified modeling software interface and method of configuring a software model which is user friendly and does not require the editing of the models data deck. Further, it is envisioned that only a limited amount of simulation knowledge would be required on the part of an engineer to run complex simulations. The system provides error checking with advice and feedback and utilizes a standard component library. In the context of simulating vehicle crashes, it allows for the easy replacement of, for example, standard dummies with a command file to recreate a model if the file fails to execute.

BRIEF DESCRIPTION OF THE DRAWINGS

The present invention will become more fully understood from the detailed description and the accompanying drawings, wherein.

DETAILED DESCRIPTION OF THE PREFERRED EMBODIMENT

Figure 1:
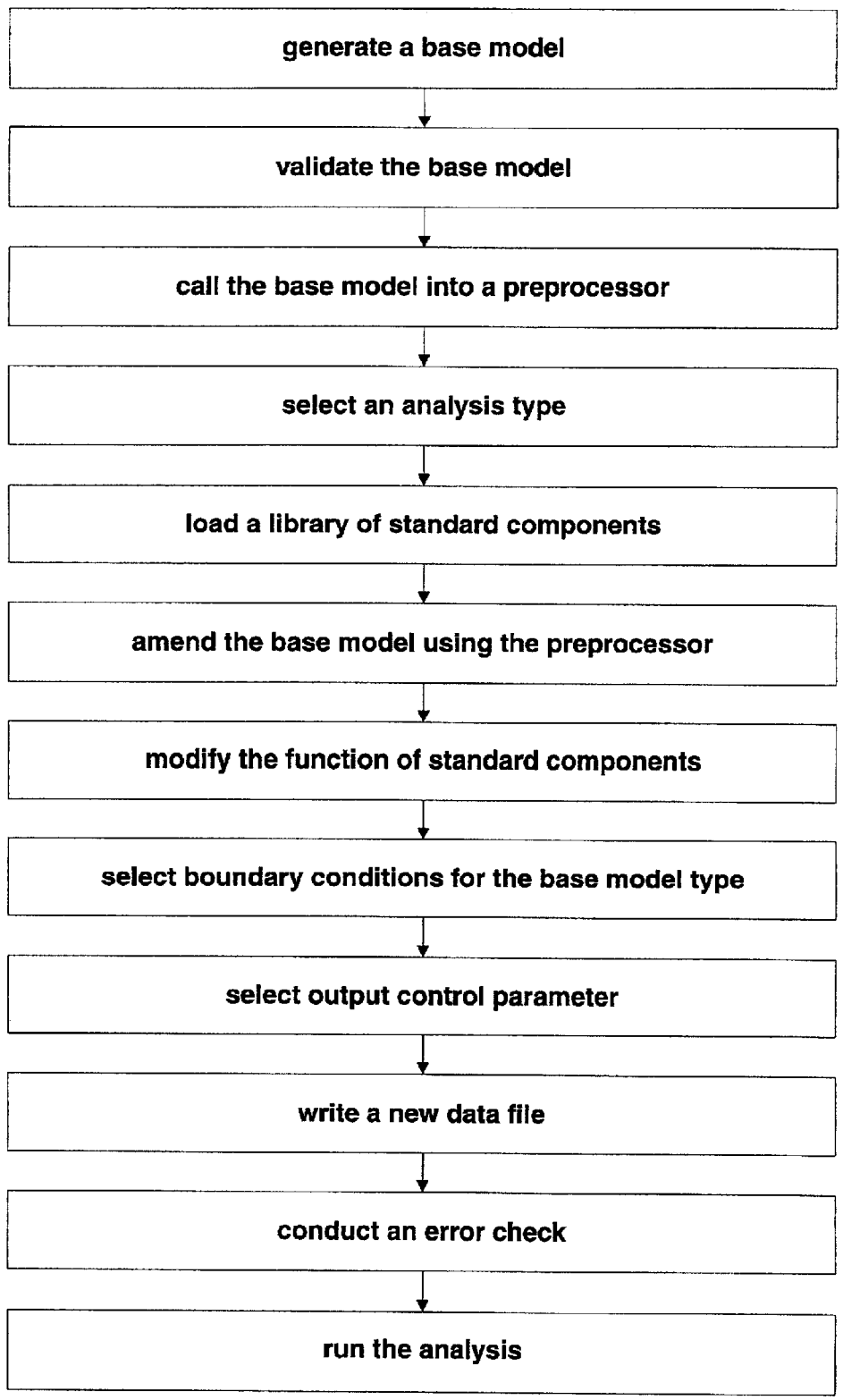
FIG. 1 is a flow chart describing the current invention.

The following description of the preferred embodiment is merely exemplary in nature and is in no way intended to limit the invention, its application, or uses.

Reference is being made to a software package by the name of MADYMO™, which is sold and marketed by TNO-MADYMO™ North America, Inc. It should be understood that modeling the ideas and concepts are applicable to any complex modeling software package.

In order for a product-based restraint engineer to work with MADYMO™, it is understood that simulation engineers will supply an existing validated model as is presently done. As used herein a "product-based restraint engineer" is the non-modeling expert second engineer with knowledge of various safety restraint products including air bag and seat belt products and one who is not specifically trained in the computer arts and is exemplary of a typical user in any field. This model will be stored in the MADYMO™ Simplification Tool. The product-based restraint engineer will be able to load the stored models make modifications; run them and review the results utilizing point and pull mehtodologies.

TABLE 1

GENERAL STEPS FOR USING THE
SYSTEM OF THE PRESENT INVENTION

Generate base model—validated (performed by qualified
MADYMO ™ expert prior to preprocessing)
Generate a unique project
Read/open project into preprocessor
Select analysis type (for example, frontal crash simulation)
Read base model
Load library of standard components
Add/remove/replace components
Modify function of standard components or the baseline model
Select boundary conditions for base model analysis type
Select output control parameters
Write new data file and error check the format
Run time 0 pre-simulation—check for errors—check model status
Run standard analysis Various types of vehicle crash scenarios can be simulated in the simulation software such as MADYMO™ software. These crash scenarios include various types of passengers such as $5^{th}$, $95^{th}$, and $50^{th}$ percentile occupants in various seating locations throughout the vehicle. Additionally, out-of-position testing can be conducted using the generated base model environment.

Variables in the data deck are defined as either an intelligent variable or fixed variable. Fixed variables are those variables that are set in the base model and cannot be changed by the engineer using the simplified user interface. Intelligent variables are those variables that can be modified by the engineer via the simplified user interface. Typically, these variables are related to a specific component of the restraint system that an engineer may wish to change. Examples of these specific components include: the airbag, seat belt, seating position, and occupant type.

The definition of which variables are fixed can be changed depending on the user's authority. For example, a restraint engineer may not have the authority to change interior vehicle geometry. An engineer at an OEM (original equipment manufacturer) may have this authority and would be allowed to change this variable. Additionally, the restraint engineer may be limited to the types of inflators that can be used in a given simulation model. For example, the inflators may be limited to only those currently in production as opposed to those slated for production. In this situation, the library of stored components, that is in this case inflators, that may be used would be limited to only those currently in production. Alternatively, the pre-processor can be written to permit the engineer to change, for example, the output of the inflator, specific inflator parameters such as pressure versus time and/or inflator temperature. Each of these parameters is defined as an intelligent variable and thus modifiable. Examples of intelligent variables in the context of safety restraint systems and components and their descriptions are shown in Tables 2, 4, 6, 8, and 10–15.

TABLE 2

AIRBAG INTELLIGENT VARIABLES

Inflator global inflator characteristics
Defined by gases, gas composition, temperature, mass
flow inflator output—(as temp scale percentage)
Tethers—length
Defined by showing original and offering new stiffness
Defined by showing original and offering scale rupture
Defined by showing original and offering new TTF (time to fire)
Defined by %, showing original and offering new subroutine
to compare to dummy free flight motion TABLE 2-continued

AIRBAG INTELLIGENT VARIABLES

Vent internal—area
Subroutine to list current size and compute change when new
size is provided
Vent external—diameter
Subroutine to list current size and compute change when new
size is provided
Subroutine to remove vent and replace with permeable panel
Cushion—permeability factor
Defined by showing original and offering to scale Profile
scale (thorax bag only)
Defined by showing original and offering new scale
factors (x, y, z) (subroutine to
scale and repost, initial position. CDEX needs to be
recalculated to maintain original vent size fold energy factor
Defined by showing original and offering percentage

TABLE 3

AIRBAG FIXED VARIABLES

Coordinates
Reference coordinates
Cushion structure elements
Materials (except permeability)
Geometry's
Support
Initial conditions (system updates)
Switch
Chamber

TABLE 4

SEAT BELT INTELLIGENT VARIABLES

Retractor—all lock variables
Defined by showing original and offering new
Loading and unloading functions
Defined by showing original and offering to scale
Webbing grabber (film spool stop) condition
If present, defined by showing original condition and offering-g
sensor inputs
If not present, not an option
Load limit—payout curve
Scale an existing curve defined by showing
original and offering scale define with
key values subroutine to convert values into a data set.
Existing stiffness overwritten
Pretensioner—retractor buckle
Retractor requires standard MADYMO ™ input
Buckle pretensioner forces a standard modeling approach and
requires separate mass
Joint stiffness
Amount of stroke
Subroutine to compare to airbag fire time
TTF—time
Defined by showing original and offering
Webbing stiffness loading and unloading, curves
Defined by showing original curves and offering, known set
(range 6%–14%)
Finite element belt—webbing, stiffness
(empirical and finite element belt)
System updates belt stiffnesses w.r.t. finite element
belt properties and empirical
loading/unloading properties
Subroutine to read-write data to both finite element and standard
belt model
Cinched tongue—friction coefficient
Subroutine to replace coefficient for the appropriate segments
Anchorage locations—coordinates for retractor, d-loop, web guide
brackets and outboard lap belt location defined by, showing—original
key inputs and redefine with new values. Subroutine to compute new
belt lengths and compare with old. Issue warnings if needed

TABLE 5

SEAT BELT FIXED PARAMETERS

None

TABLE 6

DOOR TRIM INTELLIGENT VARIABLES

Multibody:
Load displacement function—curve
Defined by showing original curve and scaling
Defined by showing original curves and offering a known set
Generate new set and replace old
Finite element:
Stress-strain function—curve
Defined by showing original curve and scaling
Defined by showing original curves and offering—known set
Generate new set and replace old
Both:
Intrusion history—curve
Defined by showing original curve and scaling-
Defined bag showing original curves and offering known set
Generate new set and replace old

TABLE 7

DOOR TRIM FIXED PARAMETERS GEOMETRY OR UNINTELLIGENT VARIABLES

Position
Degrees of Freedom
Seat intelligent variables
Subroutine needed to compute H-point of the dummy
Subroutine needed to compute change in lumbar spine to pelvis joint angle due to change in seat back angle
Seat position—fore, mid, aft
Subroutine needed to compute vertical position for fore, mid and aft
Defined by showing original position and offering, standard positions or user defined
Subroutine to compute corridor of valid positions and indicate error
Seat back angle—low, high
Defined by showing original position and offering standard positions or user defined
Subroutine to compute corridor of valid positions and indicate error
Seat lateral position—length
Defined by showing original position and offering standard positions or user defined
Seat lateral displacement time history—curve
Defined by showing original curve and scaling
Defined by showing original curves and offering known set
Generate new set and replace old

TABLE 8

SEAT INTELLIGENT VARIABLES

Model protocol: dummy is positioned relative to seat system
Seat back modeled with multiple stiffness zones
Subroutine needed to compute H-point of the dummy
Subroutine needed to compute change in lumbar spine to pelvis back joint angle due to change in seat back angle
Anti-submarine bar—curve
Defined by showing original curve and scaling
Defined by showing original curves and offering known set
Generate new set and replace old
Cushion base stiffness—curve
Defined by showing original curve and scaling
Defined by showing original curves and offering known set
Generate new set and replace old
Seat back stiffness—low, mid, upper zones—curves defined by showing original curve and scaling defined by showing original curves and offering known set. Generate new set and replace old

TABLE 8-continued

SEAT INTELLIGENT VARIABLES

Head rest
Position coordinate
Defined by showing original position and offering new inputs
Stiffness—curve
Defined by showing original curve and scaling
Defined by showing original curves and offering known set
Generate new set and replace old
Seat position—fore, mid, aft
Subroutine needed to compute vertical position for fore, mid and aft
Defined by showing original position and offering standard positions or user defined
Subroutine to compute corridor of valid positions and indicate error
Seat back angle—low, high
Defined by showing original position and offering, standard positions or user defined
Subroutine to compute corridor of valid positions and indicate error
Recliner stiffness—curve
Defined by showing, original curve and scaling
Defined by showing original curves and offering known set
Generate new set and replace old

TABLE 9

SEAT FIXED PARAMETERS

None
Boundary conditions

Additionally, components within a given model can have boundary conditions and degrees of freedom assigned. These motions can either be intelligent variables or unintelligent variables depending on the specific situation.

TABLE 10

JOINT MOTION INTELLIGENT VARIABLES

Active degree of freedom scale import/offset curves
Subroutine to show library and multiple curve plots For any given vehicle, there are an infinite number of possible crash scenarios. Corresponding to each of these crash scenarios is a predetermined though variable crash pulse or deceleration pulse for the vehicle. It is envisioned that the software would contain a library of crash pulses for a given vehicle to represent different crash scenarios. This would allow an engineer to dictate a crash event to the model and give the engineer the ability to evaluate the performance of a particular restraint system by simulating a large number of potential crashes.

TABLE 11

CRASH PULSE INTELLIGENT VARIABLES

Pulses—scale/import/offset curves
Subroutine to show library and multiple curve plots
Rear impact Traditionally, for a given crash scenario, an engineer is interested in adapting particular variables. These variables are listed by way of non-limiting example for several crash scenarios below in Tables 12 through 15.

TABLE 12

FRONTAL DRIVER

Airbag—standard bags available in database—standard methods for supports used inflator type
Tethers—location, number of—stiffness/rupture, length, rib stitch vents
Cushion diameter
Cushion material
Chamber type—single/dual
Fold energy accounted for/not accounted for
CFD—advanced
Fold—proprietary and commercially known cushion folds
Seat belt
Retractor—locking time. Spool out
Load limiter
Rip stitching
Pretensioner—buckle, retractor
Webbing stiffness
Finite element belt vs. empirical
Webbing grabber
No slip buckle
Anchorage locations
Height adjuster position
Steering column and steering wheel
Joint stiffness
Upper and lower rim stiffness load displacement (running load) break away load
Tilt
Active degrees of freedom
Knee bolster
Load vs. displacement function
Fore/aft position
Inflatable knee bolster—pick existing bag from database
Air bag
Inflator
Venting
Tethers
Support
Submarining bar—stiffness and position
Cushion stiffness
Seat back angle
Seat position fore, mid, aft
Head rest position
Toe pan
Position
Intrusion rate
Instrument panel
Position
TTF
Windscreen
Floor pan

TABLE 13

FRONTAL PASSENGER

Airbag—standard bags available in database—standard methods for supports used
Inflator type
Tethers—location. Number of. Stiffness/rupture, length, rib stitch vents
Cushion type
Cushion sizing/scaling
Cushion material
Chamber type—single/dual
Fold energy accounted for/not accounted for
CFD—advanced
Ford—proprietary and commercially known cushion folds
Seat belts
Retractor—locking time, spool out load limiter
Rip stitching
Pretensioner—buckle, retractor webbing stiffness
Finite element belt vs. empirical
Webbing grabber
No slip buckle
Anchorage locations
Height adjuster position
Knee bolster
Load vs. displacement function

TABLE 13-continued

FRONTAL PASSENGER

Fore/aft position
Independent bolster for each knee
Inflatable knee bolster—pick existing bag, from database
Airbag
Inflator
Venting
Tethers
Support
Anti-submarining bar—stiffness and position
Cushion stiffness
Seat back angle
Seat position, fore, mid, aft
Head rest position
Toe pan
Position
Intrusion rate
Instrument panel
Position
Sensor
TTF
Application—specific issues
Windscreen
Floor pan
Rear left, mid, and right seat
Anti-submarining the bar—stiffness and position
Cushion stiffness
Seat back angle and position
Seat position, fore, mid, aft
Head rest position
Front seat position
Seat belt
Retractor—locking time, spool out
Load limiter
Rip stitching
Pretensioner—buckle, retractor
Webbing, stiffness
Finite element belt vs. empirical
Webbing grabber
No slip buckle
Anchorage locations
Height adjuster position
Sensor
TTF

TABLE 14

SIDE IMPACT

Airbag—standard bags available in database of the following configurations:
Thorax (seat and door mounted)
Head thorax (seat mounted)
Inflatable curtains (roof rail mounted)
Tethers—location, number of, stiffness/rupture, length
Vents (internal and external)
Cushion material
Chamber type—single/dual/triple
Fold energy accounted for/not accounted for
CFD—advanced
Fold—IMM—I-NO folded
finite element belt
Anchorage locations
Heights adjuster position
Door trim inner panel
Deformable finite element inner and trim: material properties for mesh
Multibody only load vs. displacement function for facets/ellipsoids/planes
Intrusion history applied to bodies/nodes
Inclusion/exclusion of pole for FMVSS201
Stand off to door (gap for airbag deployment)
Seat back angle
Seat position, fore, mid, aft
Sensor
TTF

TABLE 15

REAR IMPACT (FRONT SEAT OCCUPANTS)

Seat
Anti-submarining bar—stiffness and position
Seat base cushion stiffness
Seat back cushion stiffness (adjustable in multiple zones lower, mid, upper)
Seat back angle
Seat position fore, mid, aft
Head rest position and stiffness
Recliner stiffness
Seat belt
Retractor
Rip stitching
Pretensioner—buckle-retractor webbing stiffness
Finite element belt vs. empirical
Webbing grabber
No slip buckle
Anchorage locations
Height adjuster position
Sensor
TTF Generally, the functions of the software components can be divided as follows and as also illustrated in the attached FIG. 1. Each listed component has a subset of functions:

Generate base model—validated (performed by qualified Engineer prior to preprocessing).

Generate a unique project read/open project into preprocessor.

Select analysis type read base model.

Load library of standard components.

Add/remove/replace components.

Modify function of standard components or the baseline model.

Select boundary conditions for base model file type.

Select output control parameters.

Write new data file and error check the format.

Run time 0 pre-simulation—check for errors—check model status.

Run standard analysis.

Typically, the generation of the project filed is completed by a qualified software specialist. As can be seen in Table 16, a preprocessor is used to define the general boundaries of the problem being explored which include setting access permissions for specific variables and setting items such as the project name and the directory structure.

TABLE 16

STEP 1: GENERATE/SELECT A PROJECT FILE

Description
Open up a project file in a specific account/directory and allow selection of existing files
Functionality
Create/delete/rename a project file
Read an existing file
Review top level contents of existing and archived files
Access project database
Input project description-keyword/abstract
Search database for similar projects
Identify owner/initialization/date/update date of projects
Ability to archive project at owner's discretion
Ability to compress file in neutral format
Ability to restrict access/set permissions
Allow only one user to open existing project at any time
Copy existing project to a new project

TABLE 16-continued

STEP 1: GENERATE/SELECT A PROJECT FILE

Identify version number and release date
Inputs
Project name
Directory structure
Ownership
Input test
Results
New project
New database
Defined access and permissions
Detail the project history Table 17 describes the use of the preprocessor to read and open a project into a specific environment. At this time, a base model is read into the environment if one is available. Restraint components and vehicle occupants are also provided to formulate the base model. Boundary conditions for the vehicle and restraints are also set.

TABLE 17

STEP 2: READ/OPEN PROJECT INTO ENVIRONMENT

Description
Open an existing file into software environment
Functionality
Open a file
List all steps and select the active step from list—select analysis type
Read base model
Read component library
Modify model components
Select new components
Select injury parameters
Select boundary conditions
Write a data file
Error checking
Run analysis
Analysis results
Compare results set
Show summary of project
Show history of file (time/date/owner)
File status
Inputs
Select file
Results
File is open and status is displayed
Inform user where previous session was terminated Table 18 describes the selection of an analysis type for a particular model. For example, a vehicle model can be used to simulate a front, side, or rear impact. During this stage, the software advisors will provide warnings and advice if the variables are outside of a specific range.

TABLE 18

STEP 3: SELECT ANALYSIS TYPE

Description
Select the analysis type from a standard list
Functionality
Select from list/type (hierarchy defined below)
Frontal impact (occupant and restraint options to be defined)
Side impact (occupant and restraint options to be defined)
Switch analysis type (restrict analysis type based on valid options for a given model)
Toggle model input as a function of analysis type
Undo
Indicate model status for selected type
Inputs
User selections

TABLE 18-continued

STEP 3: SELECT ANALYSIS TYPE

Results
Analysis type is set
Warnings/errors check/advice routines are executed
Warnings/errors check/advice routines for related steps Tables 19 and 20 describe the steps of reading the baseline model which was produced by the software expert and loading a standard set of components which is invisible to the user. Upon reading of the baseline model, a display of standard components which was used by the software expert is shown. Upon the loading of the library standard components invisible to the user, the library of components is available for use by the restraint engineer.

TABLE 19

STEP 4: READ BASELINE MODEL

Description
Read a released MADYMO ™ model into project file
Functionality
Read synopsis of data input through standard keywords
Identify build version of MADYMO ™ used in baseline model and issue warning if this version is not compatible or current. This should be based on MADYMO ™ input format and likely model behavior
Preview file synopsis prior to opening
Show model file history
Identify that model was successfully read
Inputs
Released MADYMO ™ file
Results
Identification of model subsections and partitioning into restraint component groups
Display standard components in model
Visualize model buttons and icons

TABLE 20

STEP 5: LOAD LIBRARY OF STANDARD COMPONENTS INVISIBLE TO USER

Description
Using the baseline model to define the model type, a library of standard analysis components related to the model type is opened to the user
Functionality
Indicate analysis type to user
Read historic data in
Known issues
Release date
Released by
Car line
Sled test #'s
Production part #'s
Related validation test
First time used
Access to a standard library
Option to skip step
Display range of components as a list or icon
For each library component
Display history of component
Define status as read-only
Inputs
Analysis type confirmations
Selection of standard or user library
Results
Library of components made available
Components that are associated with the analysis type are defined.
Display status of database while loading
"List Options" option under list of components is activated Table 21 describes the use by the restraint engineer of the software system to graphically display the model and allow for the removal and addition of components. During this step, the model automatically updates control parameters with new components and the associated interactions. Further, the software advisors display status warnings and errors.

TABLE 21

STEP 6: REMOVE/ADD/REPLACE COMPONENTS

Description
Ability to remove/add/replace components to the model using libraries that are already open
Functionality
Give access to an individual user library
Graphically display model
Graphically display current components and associated component interactions
Remove components
Add components
Replace components (option need to adopt previously associated interactions)
Display function tables associated with components and modify them
Compare/modify position/orientation/feature (function) of library component
All interaction updates need to be performed at the time of component selection (supports, contacts, force models, etc.)
Inputs
Library
Action selection (add/remove/replace/modify)
Component selection
Results
Automatically update output control parameters with new component.
Successfully update components in model and associated interactions.
Display status/error/warnings Table 22 describes Step 7 which dictates the modifying of the behavioral components and degrees of freedom for components within the model. This step automatically updates the control operative parameters with modified components and updates the components in the model and associated interactions.

TABLE 22

STEP 7: MODIFY BEHAVIOR OF COMPONENTS DEGREES OF FREEDOM, TTY'S, LOAD CURVES

Description
Ability to modify components in a revised/altered model
Functionality
Graphically display model and components
Display function of selected components
Position
Orientation
Associated interactions
Graphically manipulate tabulated functions (scale/offset/add data possible also)
Inputs
Component selection
Action selection (function/position/orientation)
Results
Automatically update output control parameters with modified component
Successfully update components in model and associated interactions
Display status/error/warnings Table 23 defines the selection and modification of boundary conditions within the model.

TABLE 23

STEP 8: SELECT BOUNDARY CONDITIONS FOR
BASE MODEL FILE TYPE DESCRIPTION

Define boundary conditions for base model file type and recommend
standard features normally used
Functionality
Select crash pulse from library/user defined
Define joint motion
Selection vs. user defined
Automatically apply to all relevant systems in a format related to the
analysis type (EuroNCAP)
Automatically update local coordinate test data into global coordinate
MADYMO ™ data
Inputs
Applied boundary conditions
Results
Model loaded and restrained relative to analysis type Table 24 describes the step which allows the user to select the output format including plots and post processing software.

TABLE 24

STEP 9: SELECT OUTPUT CONTROL PARAMETERS

Description
Allow user to select entities to yield output data used
for plotting and post processing
Functionality
Offer user a standard output configuration based on analysis type,
components, and multiple occupants
Recommend time interval for output file based on analysis type
Inputs
User selections
Screen picks
Results
Output control parameters defined Table 25 describes the writing of the new modified model data file and the error checking of the format. During this stage, the data deck for a specific model is evaluated to determine whether there are formatting or obvious error problems. At this stage, both software advisors will do an analysis of the format at obvious physical parameter errors.

TABLE 25

STEP 10: WRITE DATA FILE AND ERROR CHECK THE FORMAT

Description
Write an ASCII data file to a given directory. Prior to writing,
check file for format and obvious errors
Functionality
Choose file name, directory, ownership(?)
Define analysis method
Define run time
Offer time step selection
Define title, date, headers
Check for and offer solutions for obvious errors such as
loading conditions applied?"
Finite element model restrained
Basic errors with functions
Non zero fire times
Inflator used if air bag supplied
Reasonable material properties defined. Reasonable geometric
properties used
Output list of sensor timings
Expected contacts present
Write file
Inputs TABLE 25-continued

STEP 10: WRITE DATA FILE AND ERROR CHECK THE FORMAT

Filename
Directory
Results
Data file generated and checked for errors

Table 26 describes the run time zero presimulation check for errors. During this model check, the system will automatically perform quality control on the base file and give guidance to resolve identified issues.

TABLE 26

STEP 11: RUN TIME ZERO PRESIMULATION
CHECK FOR ERRORS—CHECK MODEL STATUS ( )

Description
Using any previously generated model file run a time zero analysis in a
temporary directory to generate output files. Check reprint file for errors
and statistics
Functionality
Automatically submit time zero run
Automatically generate temp directory
Indicate to user status of presimulation
Option to skip presimulation
Offer user commands line options
Check reprint file for warnings—indicate severity of warning and
suggest possible solutions
Check reprint file for errors and maybe to contact experienced users
Check for joint tongues, belt lengths, extrapolation warnings
Review kinematics file and check for acceptance
Check time step issues and indicate problems and suggestions if
appropriate
Identify finite element controlling time step—suggest
if improvement is required
Initial contact penetration check—contact experienced user if required
Inputs
Base file
Results
Quality controlled base file
Guidance to resolve identified issues With respect to the software advisors of the current invention, it is envisioned that the software advisor will evaluate the input files within the data deck at given times within the formation of the model. This software advisor will check the data deck for known potential errors that occur in software. For example, in MADYMO™, the definition of a load versus time or a particular function (for example seat belt loading/unloading) must have a particular format, that is enough data elements to function over the entire time period being tested in the model, otherwise an error will arise. Another example, the definition of time steps within the function must correspond to the time steps being used in the model, for example, every tenth of a second. In either of these cases, should the advisor detect an error in the setup of the model, the advisor would alert the user to this fact and allow the user to correct the model prior to allowing the model to be run.

It is also envisioned that a second software advisor, which may or may not be incorporated into the first software advisor, would be used to assist in the definition of the physical model. For example, in the development of a vehicle restraint system, years of experience with components and vehicles have been gained within the restraint industry, which an inexperienced user may not have gained. This lack of experience often leads to extended design and development cycle time as well as frequent and costly design changes. For example, in a situation where an engineer may wish to use a high output air bag inflator with a low volume air bag, the model may warn that in certain situations a failure in the cover may result, or that it might not be possible to achieve acceptable accident measurement criteria. The second software advisor would be used to employ the experience and knowledge base of the industry to attempt to overcome many of these problems before they arise, thus reducing product development and cycle time and increasing the efficiency of the design process.

What is claimed is:

1. A computer executable method for producing a computer model, operative to control a computer stored on at least one computer readable medium, the method when executed comprising:
   a) receiving a computer model formed of a plurality of variables from a first party;
   b) receiving a modification to at least one of the variables from a second party;
   c) determining whether the modification falls outside at least one predetermined criterion;
   d) if any of the modifications fall outside the at least one criteria, transmitting a message to the second party that the modification of the variable will likely result in the model producing an undesirable result.

2. The method of claim 1 wherein the model simulates a vehicle crash.

3. The method of claim 1 wherein the model simulates the interaction between at least two objects.

4. The method of claim 1 wherein a first software advisor determines whether the modification falls outside a predetermined criterion.

5. The method of claim 1 wherein the predetermined criteria is a range of one of an integer number or a real number.

6. The method of claim 1 wherein the predetermined criteria is a range of mathematical expressions.

7. The method according to claim 6 further comprising the step of recommending acceptable values.

8. The method according to claim 4 further comprising a second software advisor configured to prevent modification of a variable if the modified variable does not have a predetermined format.

9. The method according to claim 8 further including recommending an acceptable format.

10. A system for facilitating the development of a computer simulation model, the system comprising:
    a) a preprocessor interface that is configured to allow the modification of data in a computer simulation model, wherein the data can include:
       (i) a vehicle's interior geometry;
       (ii) a restraint device;
    (iii) a vehicle occupant; and
    b) a first software advisor configured to determine whether the data variable falls outside of at least one predetermined criteria.

11. The system according to claim 10 further comprising a modeling engine configured to run the simulation model.

12. The system according to claim 10 further comprising a second software advisor configured to determine whether the input variable meets a required data format.

13. The system according to claim 12 wherein the second software advisor recommends acceptable formats.

14. The system according to claim 10 wherein the first software advisor determines whether data related to a restraint device falls within the predetermined criteria.

15. The system according to claim 14 wherein first the software advisor recommends acceptable values related to a restraint device.

16. A system for facilitating the development of a computer model between a software expert and an engineer, the system comprising:
    a data deck comprising variables representing properties of physical components in a simulation model;
    a model processor for accepting the data deck and simulating an event;
    a preprocessor for allowing the software expert and the engineer to modify variables on the data deck;
    a first software advisor module configured to restrict the modification of variables within the data deck based upon engineering principles;
    a second software advisor module configured to restrict modification to variables of the data deck based on limitation of the model processor.

17. The system according to claim 16 wherein the data deck has a first set of variables whose value can be modified by a software expert but cannot be modified by the engineer.

18. The system according to claim 16 wherein the data deck comprises variables indicative of an automobile's interior.

19. The system according to claim 16 wherein the data deck contains variables representative of a vehicle's occupant.

20. The system according to claim 16 wherein the data deck contains variables indicative of a vehicle restraint system and wherein the first software advisor recommends values for the restraint system.

21. The system according to claim 20 wherein at least one of the restraint variables has a data range and wherein the first software advisor is configured to produce a warning indicator if one of the variables indicative of a vehicle restraint system is outside of a predetermined data range.

22. The system according to claim 21 wherein the warning indicator contains recommended values for the variable indicative of a vehicle restraint system.

23. The system according to claim 16 wherein at least one variable in the data deck must be input in a first format and wherein the second software advisor module is configured to generate an alarm if the variable is not inputted in the first format.

* * * * *